(12) United States Patent
Chauhan

(10) Patent No.: US 9,866,112 B1
(45) Date of Patent: Jan. 9, 2018

(54) ULTRA-LOW POWER BANDGAP REFERENCE USING A CLOCKED AMPLIFIER

(71) Applicant: Texas Instruments Incorporated, Dallas, TX (US)

(72) Inventor: Rajat Chauhan, Banglaore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/280,412

(22) Filed: Sep. 29, 2016

(51) Int. Cl.
*G05F 3/30* (2006.01)
*H02M 3/07* (2006.01)
*H03K 5/24* (2006.01)

(52) U.S. Cl.
CPC ............. *H02M 3/07* (2013.01); *H03K 5/24* (2013.01)

(58) Field of Classification Search
None
See application file for complete search history.

(56) References Cited

U.S. PATENT DOCUMENTS 9,285,822 B2 * 3/2016 Fukazawa ............... G05F 3/30

OTHER PUBLICATIONS

Chen et al., "A 2.98nW Bandgap Voltage Reference Using a Self-Tuning Low Leakage Sample and Hold," University of Michigan, Ann Arbor, MI, 2012 Symposium on VLSI Circuits Digest of Technical Papers, 2 pages.
Nikolic et al., "Improved Sense-Amplifier-Based Flip-Flop: Design and Measurements," IEEE Journal of Solid-State Circuits, vol. 35, No. 6, Jun. 2000, 9 pages.

* cited by examiner

*Primary Examiner* — Jeffrey Zweizig
(74) *Attorney, Agent, or Firm* — John R. Pessetto; Charles A. Brill; Frank D. Cimino

(57) ABSTRACT

Methods and apparatus providing an ultra-low power bandgap reference using a clocked amplifier are disclosed. An example apparatus includes a clocked comparator to compare a first voltage to a second voltage when a clock signal pulses and output a comparison signal based on the comparison, the comparison signal being (A) a first signal when the first voltage is higher than the second voltage and (B) a second signal when the first voltage is lower than the second voltage; a monoshot to when the comparison signal is a first signal, output a first pulse; and when the comparison signal is a second signal, output a second pulse; and a charge pump to increase an output voltage when the monoshot outputs the first pulse; decrease the output voltage when the monoshot outputs the second pulse; and hold the output voltage when the monoshot is not outputting a pulse.

19 Claims, 9 Drawing Sheets

US 9,866,112 B1

ULTRA-LOW POWER BANDGAP REFERENCE USING A CLOCKED AMPLIFIER

FIELD OF THE DISCLOSURE

This disclosure relates generally to bandgap references and, more particularly, to methods and apparatus for operating an ultra-low power bandgap reference using a clocked amplifier.

BACKGROUND

A bandgap reference is a circuit that produces a constant voltage regardless of variation in temperature, power supply, and/or output load. Bandgap reference circuits include active and passive components to produce the constant voltage. In some examples, bandgap reference circuits include an operational amplifier. Bandgap reference circuits are utilized in a wide variety of electronic applications such as energy harvesting, wearables, and/or coin cell operated devices. In such devices, low power consumption is desired to ensure the best possible battery life.

SUMMARY

Examples disclosed herein provide an ultra-low power bandgap reference using a clocked amplifier (clk-amp). An example apparatus includes a clocked comparator to compare a first voltage to a second voltage when a clock signal pulses and output a comparison signal based on the comparison, the comparison signal being (A) a first signal when the first voltage is higher than the second voltage and (B) a second signal when the first voltage is lower than the second voltage. The example apparatus further includes a monoshot to, when the comparison signal is a first signal, output a first pulse and, when the comparison signal is a second signal, output a second pulse. The example apparatus further includes a charge pump to increase an output voltage when the monoshot outputs the first pulse, decrease the output voltage when the monoshot outputs the second pulse, and hold the output voltage when the monoshot is not outputting a pulse.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1A:
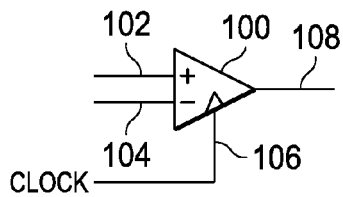
FIGS. 1A and 1B are illustrations of an example clocked amplifier and a graph showing signals associated with the example clocked amplifier.

A bandgap reference is a circuit widely used in many electronics to produce a fixed voltage invariant to variations in power supply, temperature, and/or load. A bandgap reference includes a bandgap core including both active (e.g., transistors and operational amplifiers) and passive components (e.g., resistors and capacitors) to produce the fixed voltage. As energy harvesting, wearable electronics, and coin cell operated devices increase in popularity, demands for an ultra-low power bandgap reference (e.g., drawing less than ten nanoamperes (nA)) have become highly desirable.

Conventional techniques for reducing the current drawn by a bandgap reference includes duty-cycling the active components of a bandgap reference. Such conventional techniques include turning on the bandgap core for a predetermined amount of time corresponding to the amount of time an operational amplifier of the bandgap core needs to settle the bandgap core output voltage (e.g., tON), waiting until the bandgap core output voltage has settled, sampling the output voltage, turning off the bandgap core, and repeating. For example, if a bandgap reference draws 10 microamperes (uA) of current (e.g., active current) settling time (tON) of the bandgap core is 10 microseconds, and the duty cycle is 1% at one kilohertz, the 10 uA active current can be reduced to an average of 100 nA. Lowering the settling time reduces the average current drawn. However, the settling time of such conventional techniques is limited by the limitations of the operational amplifier in the bandgap core. Examples disclosed herein describe a clocked operational amplifier (e.g., a discrete time amplifier or clk-amp) that is capable of holding an output after power supplying the clocked operational amplifier has been removed. In this manner, a bandgap core can be sampled immediately after receiving power without waiting for a conventional operation amplifier to settle on an output. The disclosed clocked operational amplifier may be implemented in a bandgap reference to reduce the current drawn from the bandgap reference to an average of 3 nA, providing a bandgap reference that is 33.3 times more power efficient than conventional bandgap references.

Examples disclosed herein describe a clocked operational amplifier that samples two inputs (e.g., a non-inverting input and an inverting input) based on a clock pulse (e.g., an edge of a clock pulse) and holds the sample (e.g., via a capacitor) until the next clock pulse is received. In some examples disclosed herein, the clocked operational amplifier includes a clocked comparator to compare the two inputs when a clock signal is pulsed. The output of the example clocked comparator is used to control a selectable monoshot circuit that controls a charge-pump. The charge pump either utilizes a power source, a ground voltage, and a capacitor (e.g., an energy storage-element) to increase, decrease, or maintain an output voltage. The output of the charge pump corresponds to a digital operational amplifier output as further described in conjunction with FIG. 1A.

In some examples disclosed herein, the clocked operational amplifier includes a differential voltage to differential time circuit to convert a voltage differential between two inputs (e.g., the negative and non-inverting inputs) into a time differential by outputting two pulses separated in time (e.g., the amount of the delay of each pulse corresponding to the corresponding input voltage). In this manner, as the difference between the two inputs increases, the amount of delay between the two pulses increases. The two delayed pulses are transmitted to a phase frequency detector circuit that controls a charge-pump based on the difference between the two delays. The charge pump either utilizes a power source, a ground voltage, and a capacitor (e.g., an energy storage-element) to increase, decrease, or maintain output voltage. The output of the charge pump corresponds to a digital operational amplifier output as further described in conjunction with FIG. 1A. Using example disclosed herein, the clocked operational amplifier provides an infinite DC gain whose bandwidth is variable (e.g., by adjusting the clock frequency). Additionally, the clocked operational amplifier disclosed herein does not require a bias current (e.g., power consumption is a function of clock speed), thereby providing reduction in quotient power compared to conventional operational amplifiers. Although examples disclosed herein utilize the disclosed example clocked amplifier in a bandgap reference. The example clocked amplifier may be utilized in various circuits where a conventional operational amplifier is used (e.g., power converters, linear regulators, linear drop out linear regulators, current reference generation circuits, etc.).

FIG. 1A illustrates an example clocked operational amplifier 100 disclosed herein to output a potential that is A times larger than the potential difference between two input terminals based on a clock signal, wherein A corresponds to the gain of the clocked operational amplifier 100. The example clocked operational amplifier 100 includes an example non-inverting input 102, an example inverting input 104, an example clock input 106, and an example output 108.

The example clocked operational amplifier 100 of FIG. 1A receives a first signal at the example non-inverting input 102, a second signal at the example inverting input 104, and a clock signal at the example clock input 106. The example clocked operational amplifier 100 computes the difference (e.g., a comparison) between the first signal at the non-inverting input 102 and the second signal based at the inverting input 104 on the clock edge at the example clock input 106. For example, the clocked operational amplifier 100 may compute the difference when the clock signal is high (e.g., above a threshold voltage), based on an edge of the clock signal, and/or based on any distinguishing point of the clock signal. The example clocked operational amplifier 100 amplifies the difference and outputs the amplified difference at the example output 108. Additionally, the example clocked operational amplifier 100 stores the computed difference until a subsequent clock pulse is received. In this manner, the example clocked operational amplifier 100 holds the example output 108 until the subsequent clock pulse is received, as further described and illustrated in FIG. 1B.

Figure 1B:
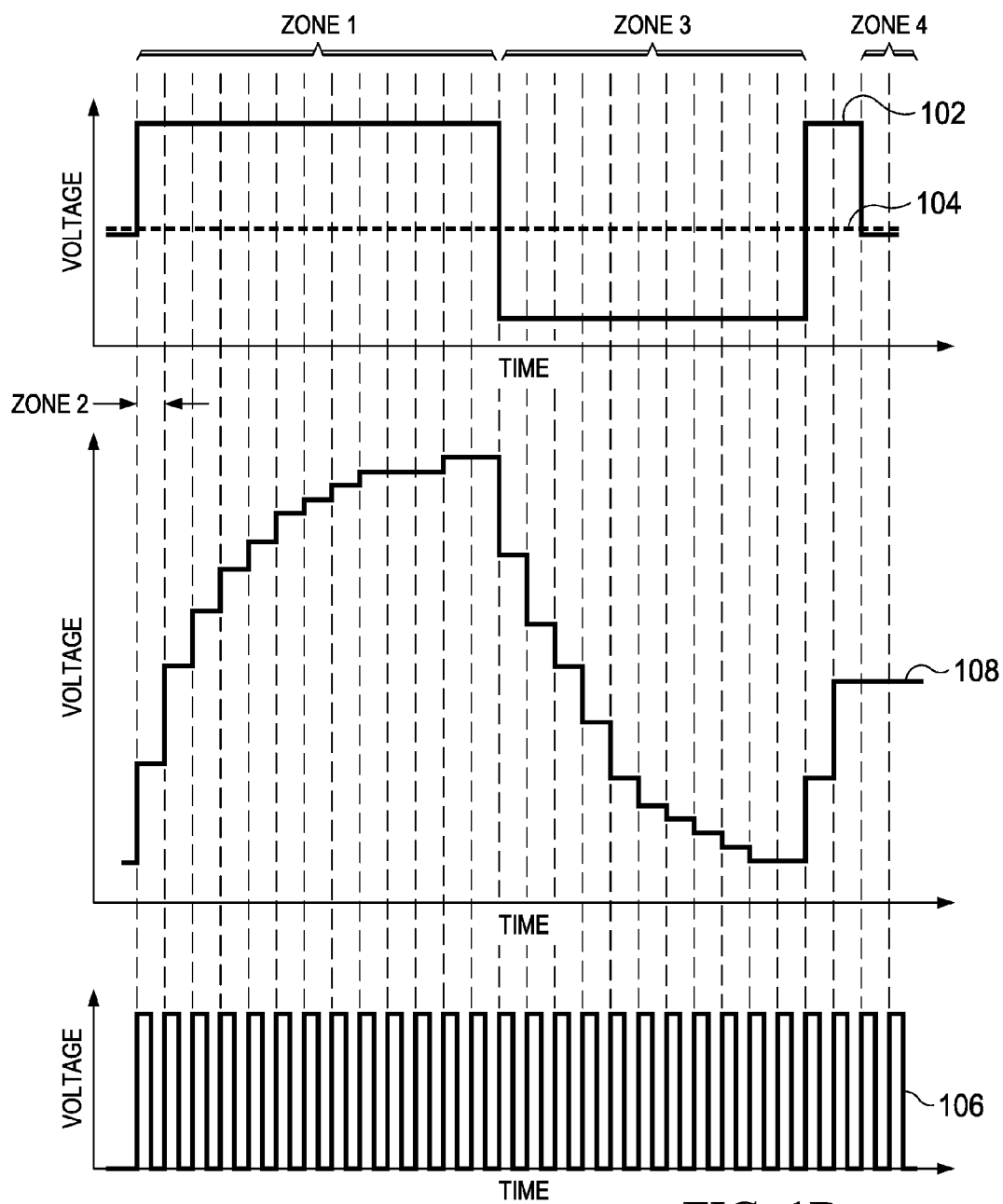

FIG. 1B illustrates graphs displaying an example operation of the example clocked operational amplifier 100 of FIG. 1A. The example graphs of FIG. 1B include a signal at the example non-inverting input 102, a signal at the example inverting input 104, a signal at the example clock input 106, and the example output 108 of FIG. 1A. In the illustrated example of FIG. 1B, the signal at the example non-inverting input 102 is a rectangular pulse voltage, the signal at the example inverting output 104 is a reference voltage (e.g., ground), and the signal at the example clock input 106 is a series of equidistant voltage pulses. Alternatively, the signal at the example non-inverting input 102, the signal at the example inverting input 104, and/or the signal at the example clock input 106 may be any type of signal.

As shown in the illustrated example of FIG. 1B, when the signal at the example non-inverting input 102 raises above the signal at the example inverting input 104 (e.g., Zone 1), the example clocked operational amplifier 100 increases the example output 108 (e.g., charges) by adding small charge packets on the example output 108 at each positive edge of the example clock 106 to generate the example output 108. After the small charge packets have been added, the example amplifier 100 holds the output 108 until a subsequent clock edge is received at the example clock input 106 (e.g., Zone 2). When the example output 108 has settled on the maximum value (e.g., has fully charged), the example output 108 is the difference between the signal at the example non-inverting input 102 and the signal at the example inverting input 104 amplified by some gain A. When the signal at the example non-inverting input 102 goes lower than the signal at the example inverting input 104 (e.g., Zone 3), the example clocked operational amplifier 100 decreases the example output 108 (e.g., discharges) by adding removing charge packets on the example output 108 at each positive edge of the example clock 106 to generate the example output 108. When the signal at the example non-inverting input 102 is substantially similar to the signal at the example inverting input 104 (e.g., Zone 4), the example amplifier 100 holds the example output 108 at a substantially steady voltage.

Figure 2:
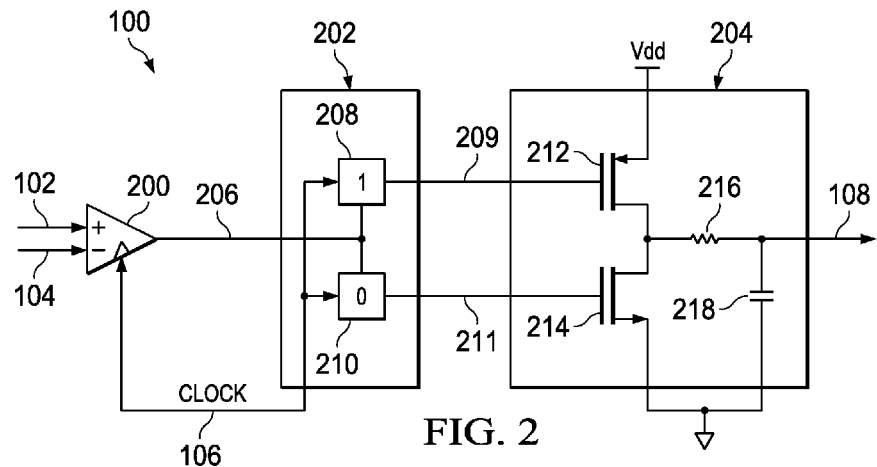
FIG. 2 is a block diagram of the example clocked amplifier of FIG. 1.

FIG. 2 is an example block diagram of the example clocked operational amplifier 100 of FIG. 1A, disclosed herein, to output a potential that is A times larger than the potential difference between two input terminals based on a clock signal, wherein A corresponds to the gain of the clocked operational amplifier 100. The example clocked operational amplifier 100 includes the example non-inverting input 102, the example inverting input 104, the example clock input 106, and the example output 108 of FIG. 1A. The example clocked operational amplifier 100 further includes an example clocked comparator 200, an example selectable monoshot generator 202, an example charge pump 204, an example clock clocked comparator output 206, an example low pulse generator 208, a first example monoshot output 209, an example high pulse generator 210, a second example monoshot output 211, an example p-channel metal oxide transistor (PMOS) 212, an example n-channel metal oxide transistor (NMOS) 214, an example resistor 216, and an example output capacitor 218.

The example clocked comparator 200 of FIG. 2 compares the voltage and/or current of the example non-inverting input 102 to the voltage and/or current of the example inverting input 104 based on the signal at the example clock 106 and outputs the example clocked comparator output 206. The example clocked comparator 200 outputs a first voltage (e.g., 3 Volts (V)), when the non-inverting input 102 is higher than the inverting input 104 and outputs a second voltage (e.g., 0V), when the non-inverting input 102 is lower than the inverting input 104. The example clocked comparator 200 only compares the inputs 102, 104 when the example clock input 106 is active (e.g., when the example clock 106 is high or based on a rising and/or falling edge of the example clock 106). When then the example clock input 106 is not active, the example clocked comparator 200 does not compare the inputs 102, 104. The example clocked comparator 200 transmits the example clocked comparator output 206 to the example selectable monoshot generator 202.

The example selectable monoshot generator 202 of FIG. 2 receives the example clocked comparator output 206 and generates a single pulse (e.g., a high pulse or a low pulse) based on the example clocked comparator output 206 when the example clock input 106 is active. The example selectable monoshot generator 202 includes the example low pulse generator 208 and the example high pulse generator 210. The example low pulse generator 208 outputs a high voltage until (A) the example clocked comparator output 206 becomes a first voltage (e.g., a high voltage) and (B) the example clock input 106 is active. When (A) the example clocked comparator output 206 goes to the first voltage and (B) the example clock input 106 is active, the example low pulse generator 208 outputs a low pulse (e.g., pulses from the high voltage to a low voltage for a predetermined duration of time). The low pulse is transmitted as the first example monoshot output 209. The example high pulse generator 210 outputs a low voltage until (A) the example clocked comparator output 206 becomes a second voltage (e.g., a low voltage) and (B) the example clock input 106 is active. When (A) the example clocked comparator output 206 goes to the second voltage and (B) the example clock input 106 is active, the example high pulse generator 210 outputs a high pulse (e.g., pulses from a low voltage to a high voltage for a predetermined amount of time). The high pulse is transmitted as the second example monoshot output 211. When the example clock input 106 is not active, the example low pulse generator 208 maintains the high voltage on the first example monoshot output 209 and the example high pulse generator 210 maintains a low voltage on the second example monoshot output 211. The first example monoshot output 209 and the example high pulse output 210 controls the example charge pump 204.

The example charge pump 204 of FIG. 2 is a three state charge pump loop filter that generates the example output 108 based on the first example monoshot output 209 and/or the example high pulse output 210 from the example selectable monoshot generator 202. The three states include a charging state (e.g., increasing the example output 108), a discharging state (e.g., decreasing the example output 108), and a neutral state (e.g., maintaining the example output 108). During the charging state, the example PMOS 212 is enabled and the example NMOS 214 is disabled, causing the example voltage source Vdd to charge the example capacitor 218 via the example resistor 216. Charging the example capacitor 218 causes a voltage differential, thereby causing the example output 108 to increase. During a discharging state, the example PMOS 212 is disabled and the example NMOS is enabled, causing the voltage stored in the example capacitor 218 to discharge to ground via the example resistor 216. Discharging the example capacitor 218 decreases the voltage differential, causing the example output 108 to decrease. In the neutral state, the example PMOS 212 and the example NMOS 214 are disabled, causing the example capacitor 218 to maintain the output voltage 108 (e.g., holding the example output voltage 108 substantially stable). Although the illustrated capacitor 218 is connect to ground (e.g., the bottom terminal of the example capacitor 218), the example capacitor 218 may be connected to any direct current (DC) voltage level based on how the example clocked amplifier 100 is utilized.

In operation, the example charge pump 204 of FIG. 2 initializes to a neutral state, where the example capacitor 218 holds the example output voltage 108 at the amount of voltage stored in. When the example clock input 106 is activated (e.g., based on a clock edge and/or the clock input 106 being a high voltage), the example clocked comparator 200 compares the signal at the example non-inverting input 102 to the signal at the example inverting input 104. When the signal at the example non-inverting input 102 is higher than the signal at the example inverting input 104, the example clocked comparator 200 outputs the example clocked comparator output 206 as a high voltage. When the signal at the example non-inverting input 102 is lower than the signal at the example inverting input 104, the example clocked comparator 200 outputs the example clocked comparator output 206 as a low voltage. The example clocked comparator output 206 is transmitted to the example selectable monoshot generator 202.

When the example clocked comparator output 206 of FIG. 2 is a high voltage, the example low voltage pulse generator 208 generates a low voltage pulse on the first example monoshot output 209. When the example clocked comparator output 206 is a low voltage, the example high voltage pulse generator 210 generates a high voltage pulse on the second example monoshot output 211. When the first example monoshot output 209 pulses low, the example PMOS 212 of the example charge pump 204 is enabled causing the voltage source Vdd to charge the example capacitor 218. As described above, charging the example capacitor 218 causes the example output voltage 108 to increase. When the second example monoshot output 211 pulses high, the example NMOS 214 of the example charge pump 204 is enabled causing the example capacitor 218 to discharge to ground. As described above, discharging the example capacitor 218 causes the example output voltage 108 to decrease. When the example clock input 106 is inactive, neither the example PMOS 212 nor the example NMOS 214 is enabled, causing the charge on the example capacitor 218 to remain, thereby causing the example output 108 to remain substantially stationary.

Figure 3A:
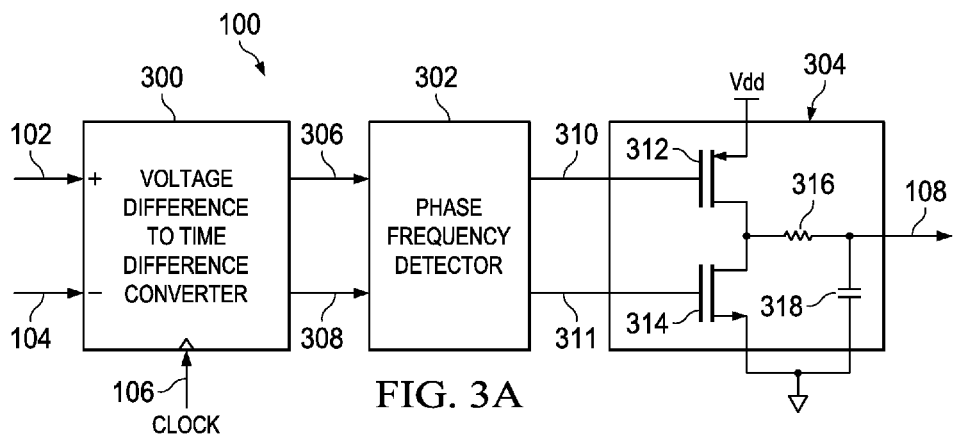
FIGS. 3A and 3B are alternative block diagram of the example clocked amplifier of FIG. 1.
Figure 3B:
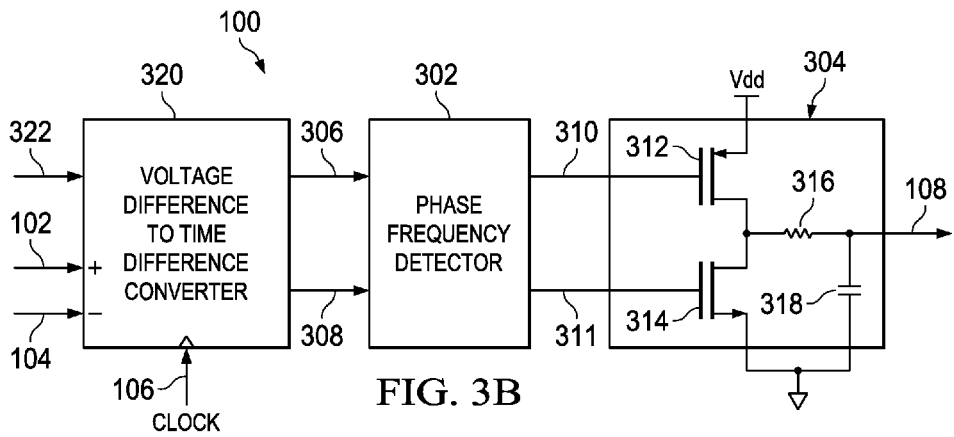

FIGS. 3A and 3B are alternative example block diagrams of the example clocked operational amplifier 100 of FIG. 1A, disclosed herein, to output a potential that is A times larger than the potential difference between two input terminals based on a clock signal, wherein A corresponds to the gain of the clocked operational amplifier 100. The example clocked operational amplifier 100 of FIGS. 3A and 3B include the example non-inverting input 102, the example inverting input 104, the example clock input 106, and the example output 108 of FIG. 1A. The example clocked operational amplifier 100 of FIG. 3A further includes an example voltage difference-to-time difference (VDTD) converter 300, an example phase frequency detector 302, an example charge pump 304, a first example voltage-to-time (VT) output 306, a second example VT output 308, a first example phase frequency output 310, a second example phase frequency output 311, an example PMOS 312, an example NMOS 314, an example resistor 316, and an example output capacitor 318. The example clocked operational amplifier 100 of FIG. 3B further includes the example phase frequency detector 302, the example charge pump 304, the first example VT output 306, the second example VT output 308, the first example phase frequency output 310, the second example phase frequency output 311, the example PMOS 312, the example NMOS 314, the example resistor 316, the example output capacitor 318 of FIG. 3A, an example VDTD converter 320, and an example bias voltage (Vbias) 322.

The example VDTD converter 300 of FIG. 3A receives the example non-inverting voltage input 102 and outputs a pulse on the first example VT output 306 based on the amount of voltage at the example non-inverting voltage input 102, when the example clock input 106 is active. The pulse includes a delay that corresponds to the voltage at the example non-inverting input 102. For example, if the example voltage at the example non-inverting voltage input 102 is high, the example delay corresponding to the pulse of the first example VT output 306 will be relatively short compared to a low voltage at the example non-inverting voltage input 102. Additionally, the example VDTD converter 300 receives the voltage at the example inverting input 104 and outputs a pulse on the second example VT output 308 based on the amount of voltage at the example inverting input 104. The pulse includes a delay that corresponds to the voltage at the example inverting input 104. For example, if the voltage of the example inverting input 104 is high, the example delay corresponding to the pulse of the second example VT output 308 will be relatively short compared to a low voltage at the example inverting input 104. In this manner, the first example VT output 306 and the second VT output 308 will pulse at different times corresponding to the difference between the first voltage at the example non-inverting voltage input 102 and the second voltage at the example inverting input 104. An example hardware implementation of the VDTD converter 300 is further described and illustrated in conjunction with FIG. 4.

The example phase frequency detector 302 of FIGS. 3A and 3B receives the first and second VT outputs 306, 308 from the example VDTD converter 300 and outputs a low pulse at the first example phase frequency output 310 or a high pulse at the second example phase frequency output 311 based on the difference in delay of the first example VT output 306 and the second example VT output 308. The first example phase frequency output 310 is initialized to a high voltage and the second example phase frequency output 311 is initialized to a low voltage. However, the first and second example frequency outputs 310, 311 may be initialized to any voltage. When the first example VT output 306 occurs before the second example VT output 308, the first example frequency output 310 is pulsed low (e.g., from the initial high voltage). The larger the difference between the first example VT output 306 and the second example VT output 308 the longer the low pulse (e.g., the wider the low pulse). For example, when the difference is 10 nanoseconds, the first example phase frequency output 310 may be low pulsed for 3 nanoseconds and when the difference is 5 nanoseconds, the first example phase frequency output 310 may be low pulsed for 1 nanosecond. Additionally, when the first example VT output 306 occurs after the second example VT output 308, the second example frequency output 311 is pulsed high (e.g., from the initial low voltage). The larger the difference between the first example VT output 306 and the second example VT output 308 the longer the high pulse (e.g., the wider the high pulse).

The example charge pump 304 of FIGS. 3A and 3B is a three state charge pump loop filter that generates the example output 108 based on the first and/or second phase frequency output 310, 311 from the example phase frequency detector 302. As previously described in conjunction with FIG. 2, the three states include a charging state (e.g., increasing the example output 108), a discharging state (e.g., decreasing the example output 108), and a neutral state (e.g., maintaining the example output 108). A low pulse of the first example phase frequency output 310 enables the example PMOS 312 corresponding to the charging state (e.g., increasing of the example output 108), a high pulse of the second example phase frequency output 311 enables the example NMOS 311 corresponding to the discharging state (e.g., decreasing the example output 108), and no pulses on either frequency output 310, 311 disables both transistors 312, 314 corresponding to a stable capacitor 318 at the neutral state (e.g., maintaining the example output 108). Although the illustrated capacitor 318 is connect to ground (e.g., the bottom terminal of the example capacitor 318), the example capacitor 318 may be connected to any direct current (DC) voltage level based on how the example clocked amplifier 100 is utilized.

The example VDTD converter 320 of FIG. 3B is an alternative example that includes an additional input for the example Vbias 322 for controlling a current source of the example VDTD converter 320. The example VDTD converter 320 may receive the example Vbias 322 to control a current source within the example VDTD converter 320 to determine a time differential corresponding to the voltage differential at the example inputs 102, 104. An example hardware implementation of the VDTD converter 320 is further described and illustrated in conjunction with FIG. 5.

Figure 4:
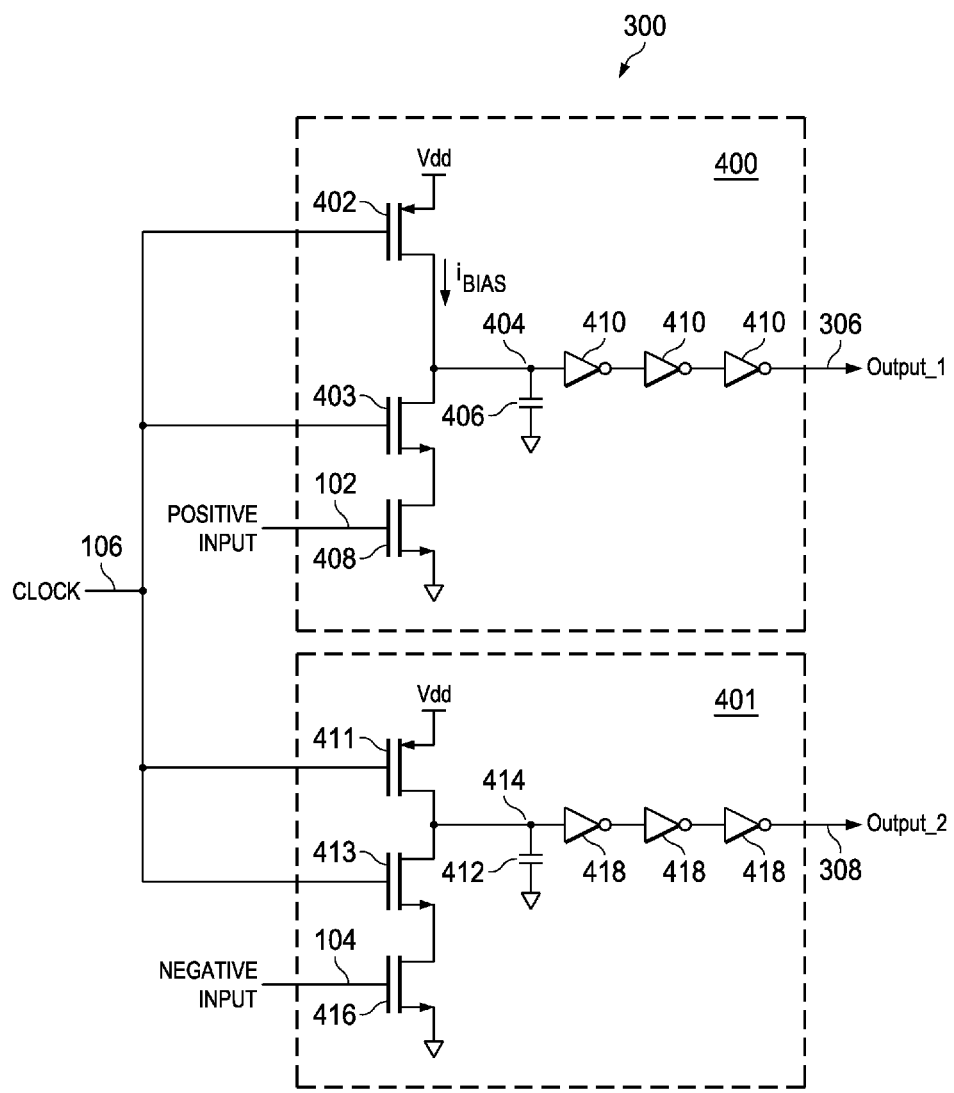
FIG. 4 is an example circuit implementation of a voltage difference to time difference converter of FIG. 3A.

FIG. 4 is an example hardware implementation of the example VDTD converter 300 of FIG. 3A. The example VDTD converter 300 includes the example non-inverting input 102, the example inverting input 104, the example clock input 106, the first example VT output 306, and the second example VT output 308 of FIG. 3A. The example VDTD converter 300 of FIG. 4 further includes a first example converter half 400, a second example converter half 401, a first example PMOS 402, an example clock-controlled NMOS 403, a first example node 404, a first example capacitor 406, a first example NMOS 408, first example inverters 410, a second example PMOS 411, a second example capacitor 412, an example clock-controlled NMOS 413, a second example node 414, a second example NMOS 416, and second example inverters 418. As described above in conjunction with FIG. 3, the first converter half 400 of the example VDTD converter 300 outputs a first pulse on the example VT output 306 and the second converter half 401 of the example VDTD converter 300 outputs a second pulse on the example VT output 308. The difference in time between the fist pulse and the second pulse directly corresponds to the difference in voltage at the non-inverting input 102 and the inverting input 104.

The first example converter half 400 of FIG. 4 receives a voltage at the example non-inverting input 102 and outputs a delayed pulse at the first example VT output 306. The amount of the delay corresponds to the amount of voltage at the non-inverting input 102. The first example converter half 400 includes the example PMOS transistor 402, whose gate is coupled to the example clock input 106. When the example clock input 106 is low, the example PMOS transistor 402 is enabled and the example clock controlled NMOS 403 is disabled causing a voltage source Vdd to charge the example capacitor 406 causing the example node 404 to increase to a first voltage (e.g., high voltage). The voltage at the example node 404 is delayed and inverted (e.g., to a low voltage) by the example inverters 410. The delayed, inverted voltage corresponds to the first example VT output 306. Although in the illustrated example of FIG. 4, there are three inverters, there may be any number of inverters. When the example clock input 106 goes to a high voltage, the example PMOS 402 is disabled, the example clock-controlled NMOS 403 is enabled, and the example non-inverting input 102 enables the example NMOS 408, thereby causing the example capacitor 406 to discharge. The discharge of the example capacitor 406 causes the voltage at the example node 404 to fall, thereby increasing the first example VT output 306. The larger the voltage at the example non-inverting input 102, the faster the example capacitor 406 discharges. Thus, the higher the voltage at the example non-inverting input 102, the fast the first example VT output 306 pulses to a high voltage (e.g., the shorter the delay). Likewise, the lower the voltage at the example non-inverting input 102, the slower the first example VT output 306 pulses to a high voltage (e.g., the longer the delay).

The second example converter half 401 of FIG. 4 is substantially similar to the first example converter half 400. The only difference is that the second example converter half 401 receives a voltage at the inverting input 104. For example, the properties (e.g., capacitance, impedance, inductance, etc.) of the second example PMOS 411, the second example capacitor 412, the example clock-controlled NMOS 413, the second example NMOS 416, and the second example inverters 418 are substantially similar to the first example PMOS 402, the first example capacitor 406, the first example NMOS 408, and the first example inverters 410 such that when the voltage at the example non-inverting input 102 and the voltage at the example inverting input 104 are the same voltage, the delays corresponding to the first example VT output 306 and the second example VT output 308 are the same. In this manner, when the voltages at the example non-inverting input 102 and the example inverting input 104 are different, the difference in the delay of the example VT outputs 306, 308 accurately correspond to the difference in the input voltages. The gain (A) of the example VDTD 300 is equivalent to equation 1 shown below:

$$A = \frac{DT_{out}}{DV_{in}} = \frac{cg_{mn}v_{trip}}{i_{bias}^2}$$ (Equation 1)

Where c is the capacitance of the example capacitor 406, $g_{mn}$ is the transconductance of the example NMOS 408, Vtrip is a trip point of one of the example inverters 410, 418, and $i_{bias}$ is a bias current between the example PMOS 402 and the example NMOS 408. Ibias is a function of common-mode voltage of the example inputs 102, 104.

Figure 5:
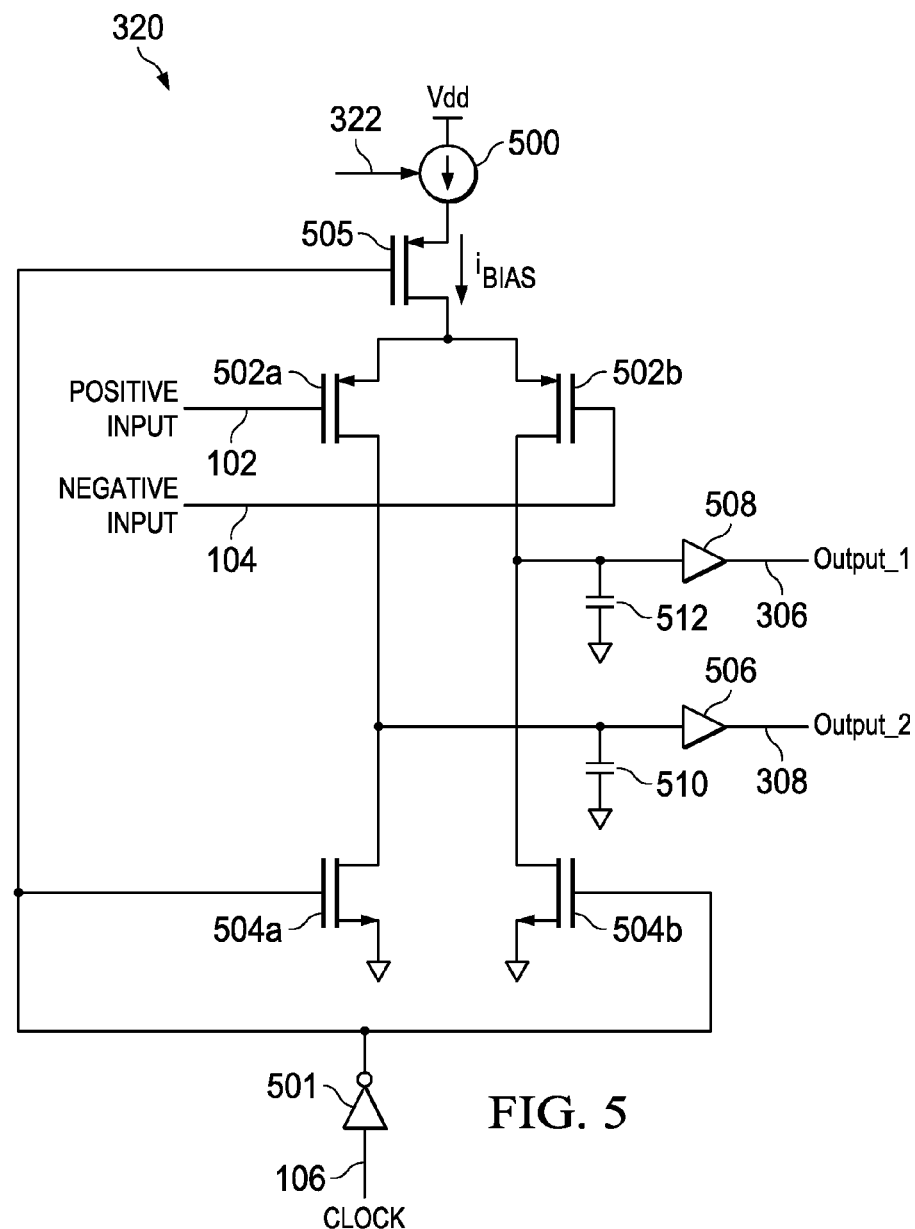
FIG. 5 is an example circuit implementation of a voltage difference to time difference converter of FIG. 3B.

FIG. 5 is an example hardware implementation of the example VDTD converter 320 of FIG. 3B. The example VDTD converter 320 includes the example non-inverting input 102, the example inverting input 104, the example clock input 106, the example output 108, the first example VT output 306, the second example VT output 308, and the example Vbias 322 of FIG. 3B. The example VDTD converter 320 of FIG. 5 further includes an example current source 500, an example inverter 501, example PMOSs 502a, 502b, 505 example NMOSs 504a, 504b, example buffers 506, 508, and example capacitors 510, 512. As described above in conjunction with FIG. 3B, the example VDTD converter 320 may be used when a feedback bias is necessary.

When the example clock input 106 of FIG. 5 is high, the example inverter 501 inverts the clock input 106 to a low voltage, thereby enabling the example PMOS 505 and disabling the example NMOS transistors 504a, 504b. The example current source 500 supplies current (e.g., ibias) to the sources of the example PMOS transistors 502a, 502b based on the example Vbias 322. When the current source 500 provides current, the current is split among the PMOS transistors 502a, 502b. If the voltage at the non-inverting input 102 is the same as the voltage at the inverting input 104, the current will be split evenly. If the voltage at the non-inverting input 102 is higher than the voltage at the inverting input 104, then the current that flows through the first example PMOS 502a will be smaller than the current that flows through the second example PMOS 502b. If the voltage at the non-inverting input 102 is lower than the voltage at the inverting input 104, then the current that flows through the second example PMOS 502b will be larger than the current that flows through the second example PMOS 502b.

The example buffer 506 of FIG. 5 receives the voltage stored at the first example capacitor 510 and the example buffer 508 receives the voltage stored at the second example capacitor 512. The example buffers 506, 508 have a same trip point Vtrip. A trip point is a voltage that, when satisfied changes the output of the example buffers 506, 508. For example, if the trip point of the example buffer 506 is 1.3 V, then when the example buffer 506 receives a voltage greater than or equal to 1.3 V, the example buffer 506 will output a high voltage and when the example buffer 506 receives a voltage less than 1.3 V, the example buffer 506 will output a low voltage. The higher the voltage at the example non-inverting input 102, the slower the voltage across the first example capacitor 510 will increase when the example PMOS 502a is enabled (e.g., since the example current through the example PMOS 502a will decrease). Thus, the higher the voltage at example non-inverting input 102, the slower the trip point will be reached, causing the second example VT output 308 to pulse at a longer delay. Similarly, the higher the voltage at the example inverting input 104, the slower the trip point of the second example buffer 508 will be reached, causing the first example VT output 306 to pulse at a longer delay. Thus, the delay of the first and second VT outputs 306, 308 will correspond to the voltages at the example inverting input 104 and the example non-inverting input 102. The gain of the example VDTD 320 is equivalent to equation 2 shown below:

$$A = \frac{DT_{out}}{DV_{in}} = \frac{cg_{mp}v_{trip}}{i_{bias}^2}$$ (Equation 2)

Where c is the capacitance of the first example capacitor 510 and the capacitance of the second example capacitor 512, $g_{mp}$ is the transconductance of the example PMOSs 502a, 502b, dv is a trip point of one of the example buffer 506, 508, and $i_{bias}$ is a bias current through the example PMOS 502a, 502b. When the example clock input 501 goes low, the example inverter 501 outputs a high voltage to disable the example PMOS 505 and enable the example NMOSs 504a, 504b, allowing the example capacitors 512, 510 to discharge.

While example manners of implementing the example clocked operational amplifier 100 of FIG. 1 are illustrated in FIGS. 2, 3A, and 3B, elements, processes and/or devices illustrated in FIGS. 2, 3A, and 3B may be combined, divided, re-arranged, omitted, eliminated and/or implemented in any other way. Further, the example clocked comparator 200, the example selectable monoshot 202, the example charge pump 204, the example VDTD converter 300, the example phase frequency detector 302, the example charge pump 304, the example VDTD converter 320, and/or, more generally, the example clocked operational amplifier 100 of FIGS. 2, 3A, and 3B, may be implemented by hardware, machine readable instructions, software, firmware and/or any combination of hardware, machine readable instructions, software and/or firmware. Thus, for example, any of the example clocked comparator 200, the example selectable monoshot 202, the example charge pump 204, the example VDTD converter 300, the example phase frequency detector 302, the example charge pump 304, the example VDTD converter 320, and/or, more generally, the example clocked operational amplifier 100 of FIGS. 2, 3A, and 3B, could be implemented by analog and/or digital circuit(s), logic circuit(s), programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example clocked comparator 200, the example selectable monoshot 202, the example charge pump 204, the example VDTD converter 300, the example phase frequency detector 302, the example charge pump 304, the example VDTD converter 320, and/or, more generally, the example clocked operational amplifier 100 of FIGS. 2, 3A, and 3B, is/are hereby expressly defined to include a tangible computer readable storage device or storage disk such as a memory, a digital versatile disk (DVD), a compact disk (CD), a Blu-ray disk, etc. storing the software and/or firmware. Further still, the example clocked operational amplifier 100 of FIGS. 2, 3A, and 3B includes elements, processes and/or devices in addition to, or instead of, those illustrated in FIGS. 2, 3A, and 3B, and/or may include more than one of any or all of the illustrated elements, processes and devices.

Figure 6:
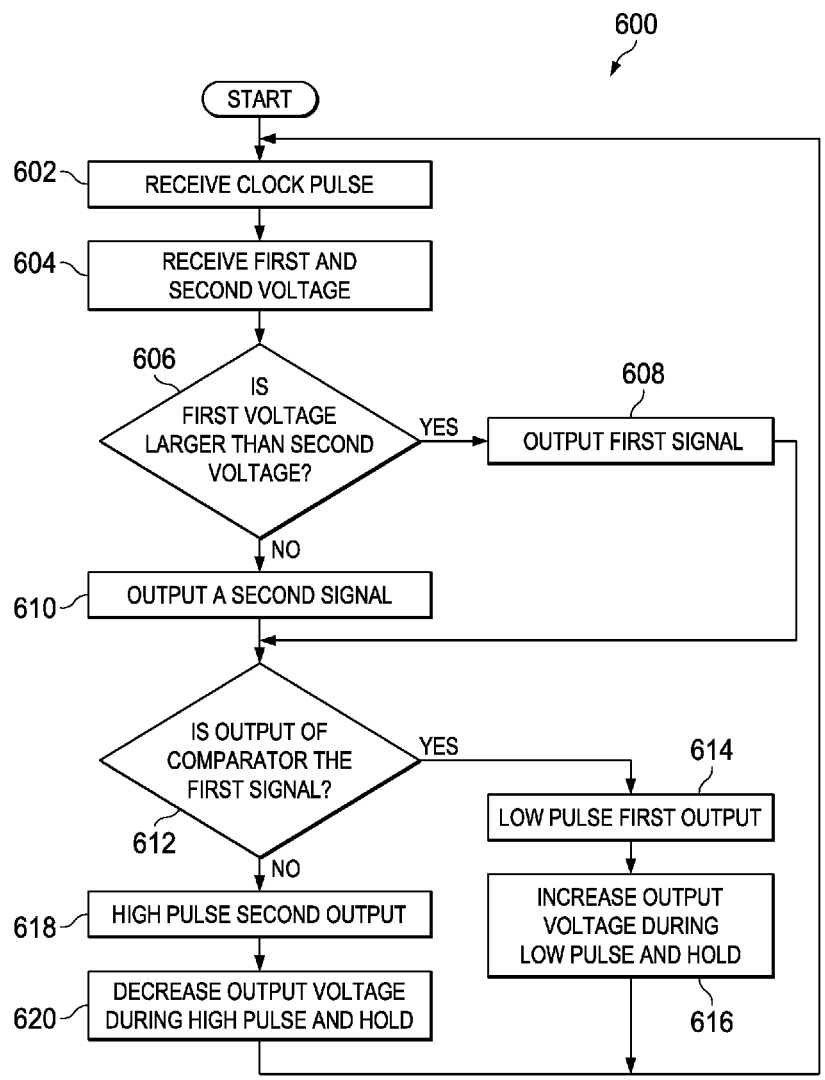
FIG. 6 is a flowchart representative of example machine readable instructions that may be executed to implement the example clocked amplifier of FIG. 2 to amplify a difference between two inputs based on a clock signal.
Figure 7:
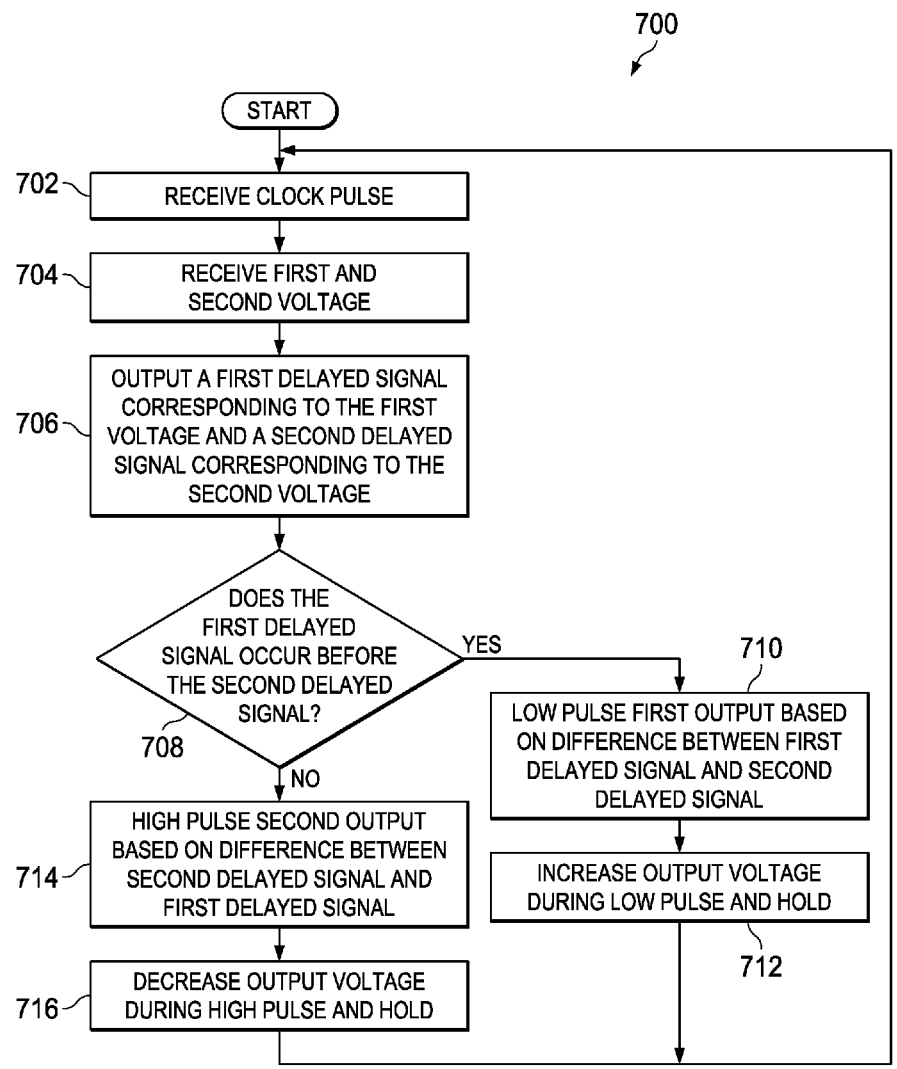
FIG. 7 is a flowchart representative of example machine readable instructions that may be executed to implement the example clocked amplifier of FIGS. 3A and 3B to amplify a difference between two inputs based on a clock signal.

A flowchart representative of example machine readable instructions for implementing the example clocked operational amplifier 100 of FIG. 2 is shown in FIG. 6 and a flowchart representative of example machine readable instructions for implementing the example clocked operational amplifier 100 of FIGS. 3A and 3B is shown in FIG. 7. In the examples, the machine readable instructions comprise a program for execution by a processor such as the processor 1012, 1112 shown in the example processor platform 1000, 1100 discussed below in connection with FIGS. 10 and 11. The program may be embodied in machine readable instructions stored on a tangible computer readable storage medium such as a CD-ROM, a floppy disk, a hard drive, a digital versatile disk (DVD), a Blu-ray disk, or a memory associated with the processor 1012, 1112, but the entire program and/or parts thereof could alternatively be executed by a device other than the processor 1012, 1112 and/or embodied in firmware or dedicated hardware. Further, although the example program is described with reference to the flowchart illustrated in FIGS. 6 and 7, many other methods of implementing the example clocked operational amplifier 100 of FIGS. 2, 3A, and 3B may alternatively be used. For example, the order of execution of the blocks may be changed, and/or some of the blocks described may be changed, eliminated, or combined.

As mentioned above, the example processes of FIGS. 6 and 7 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 6 and 7 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 6 is an example flowchart 600 representative of example machine readable instructions that may be executed by the example clocked operational amplifier 100 of FIG. 2 to output a potential that is A times larger than the potential difference between two input terminals based on a clock signal.

At block 602, the example clocked comparator 200 and/or the example selectable monitor generator 202 receive a clock pulse at the example clock input 106. As described above in conjunction with FIG. 1, the clock enables operation of the example clocked operational amplifier 100. For example, the example clocked comparator 200 and/or the example selectable monoshot generator 202 are enabled when the example clock input 106 is high or based on an edge (e.g., a rising or falling edge) of the example clock input 106. At block 604, the example clocked comparator 200 receives a first voltage at the example non-inverting input 102 and a second voltage at the example inverting input 104.

At block 606, the example clocked comparator 200 determines if the first voltage is larger than the second voltage. If the first voltage is larger than the second voltage, then the example clocked comparator 200 outputs a first signal (e.g., a high voltage) (block 608). If the first voltage is not larger than the second voltage (e.g., the second voltage is higher than the first voltage), the example clocked comparator 200 outputs a second signal (e.g., a low voltage or ground) (block 610). In this manner, the example clocked comparator 200 identifies whether the non-inverting input 102 or the inverting input 104 is a larger voltage.

At block 612, the example selectable monoshot generator 202 determines if the output of the example clocked comparator 200 is the first signal (e.g., a high voltage). As described above, a high voltage corresponds to the example non-inverting input 102 being higher than the example inverting input 104. If the example selectable monoshot generator 202 determines that the output of the example clocked comparator 200 is the first signal, the example selectable monoshot generator 202 low pulses the first example monoshot output 209 (block 614). At block 616, the example charge pump 204 increases the output voltage 108 during the low pulse and holds the increased output voltage 108 via the example capacitor 218 while the process repeats for a subsequent clock pulse. As described above in conjunction with FIG. 2, the example charge pump 204 may increase and hold the example output voltage 108 by charging and storing a supply voltage Vdd in the example capacitor 218 when the example PMOS 212 is enabled.

If the example selectable monoshot generator 202 determines that the output of the example clocked comparator 200 is not the first signal (e.g., the output is the second signal (a low voltage)), the example selectable monoshot generator 202 high pulses the second example monoshot output 211 (block 618). At block 620, the example charge pump 204 decreases the output voltage 108 during the high pulse and holds the increased output voltage 108 while the process repeats for a subsequent clock pulse. As described above in conjunction with FIG. 2, the example charge pump 204 may decrease and hold the example output voltage 108 via the example capacitor 218 by discharging and the stored voltage in the example capacitor 218 when the example NMOS 214 is enabled.

FIG. 7 is an example flowchart 700 representative of example machine readable instructions that may be executed by the example clocked operational amplifier 100 of FIGS. 3A and 3B to output a potential that is A times larger than the potential difference between two input terminals based on a clock signal.

At block 702, the example VDTD converter 300, 320 receives a clock pulse at the example clock input 106. As described above in conjunction with FIG. 1, the clock pulses enable operation of the example clocked operational amplifier 100. For example, the VDTD converter 300, 320 is enabled when the clock input 106 is high or based on an edge (e.g., a rising or falling edge) of the example clock input 106. At block 704, the example VDTD converter 300, 320 receives a first voltage at the example non-inverting input 102 and a second voltage at the inverting input 104.

At block 706, the example VDTD converter 300, 320 outputs a first delayed signal (e.g., the first example VT output 306) corresponding to the first voltage at the example non-inverting input 102 and a second delayed signal (e.g., the second example VT output 308) corresponding to the second voltage at the example inverting input 104. As described above in conjunction with FIGS. 3A and 3B, when the first voltage is larger than the second voltage, the delay corresponding to the first voltage will be smaller than the delay corresponding to the second voltage. Additionally, when the first voltage is smaller than the second voltage, the delay corresponding to the first voltage will be larger than the delay corresponding to the second voltage.

At block 708, the example phase frequency detector 302 determines if the first example delayed signal occurred before the second example delayed signal. As described above, the amount of delay of the delayed signals (e.g., at the first and second example VT outputs 306, 308) corresponds to the voltage at the example inputs 102, 104. If the example phase frequency detector 302 determines that the first example delayed signal occurs before the second example delayed signal, the example phase frequency detector 302 low pulses the first example phase frequency output 310 (e.g., from a high voltage) based on the difference between the first delayed signal and the second delayed signal (block 710). For example, the example phase frequency detector 302 low pulses the first example phase frequency output 310 for longer when the difference between the first delayed signal and the second delayed signal is larger. At block 712, the example charge pump 304 increases the example output 108 during the low pulse and holds the increased output voltage 108 while the process repeats for a subsequent clock pulse. The example charge pump 304 may increase and hold the example output voltage 108 by charging and storing a supply voltage Vdd in the example output capacitor 318 when the example PMOS 312 is enabled.

If the example phase frequency detector 302 determines that the first delayed signal does not occur before the second delayed signal, the example phase frequency detector 302 high pulses the second phase frequency output 311 based on the difference between the second delayed signal and the first delayed signal (block 714). At block 716, the example charge pump 304 decreases the output voltage 108 during the high pulse and holds the increased output voltage 108 while the process repeats for a subsequent clock pulse. As described above in conjunction with FIGS. 3A and 3B, the example charge pump 304 may decrease and hold the example output voltage 108 by discharging and the stored voltage in the example output capacitor 318 when the example NMOS 314 is enabled.

Figure 8:
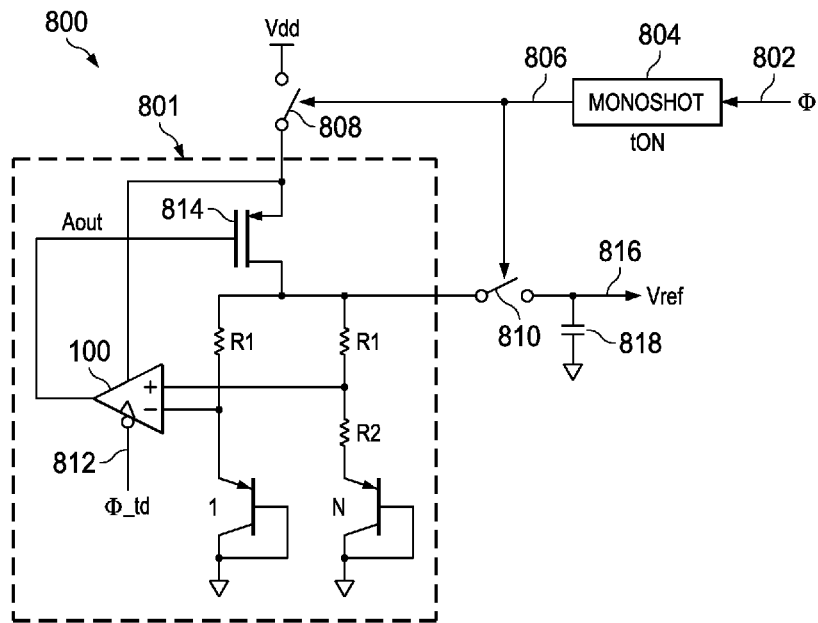
FIG. 8 is an example bandgap reference using the example clocked amplifier of FIGS. 1, 2, 3A, and 3B.

FIG. 8 is a circuit structure for an example bandgap reference 800 utilizing the example clocked operational amplifier 100 of FIGS. 1, 2, 3A, and/or 3B disclosed herein to provide a fixed voltage that does not vary with variations in power supply, temperature, and/or load. The example bandgap reference 800 includes an example bandgap core 801, an example clock signal 802, an example monoshot generator 804, an example tON signal 806, example switches 808, 810, an example delayed clock signal 812, an example PMOS 814, an example reference voltage (Vref) 816, and an example output capacitor 818.

The example bandgap core 801 of FIG. 8 includes active and passive components including the example clocked operational amplifier 100 and the example PMOS 814 to generate the example Vref 816. Although the example bandgap core 801 is illustrated in a particular circuit structure, the example bandgap core 801 may be structured using any bandgap core circuit structure. The example bandgap core 801 generates the example Vref 816 by utilizing the example clocked operational amplifier 100 to bias the example PMOS 814 which causes the example output capacitor 818 to charge and/or discharge to increase and/or decrease the example Vref 816. To decrease the amount of current drawn by the example bandgap core 801, a duty cycle switch scheme is utilized to power-on the example bandgap core 801 and sample the example Vref 816 every X seconds and power-off the example bandgap core 801 when the example Vref 816 is not being sampled. As described above, because the example clocked operational amplifier 100 holds its output voltage when the example delayed clock signal 812 is not being pulsed, the example clocked operational amplifier 100 requires significantly less time to stabilize the output voltage in every transition from an OFF state to an ON state while duty cycling than a conventional bandgap core using a conventional operational amplifier.

The duty cycle switch scheme includes the example clocked signal 802, the example monoshot generator 804, the example tON signal 806, and the example switches 808, 810 of FIG. 8. The example monoshot generator 804 generates a pulse on the example tON signal 806 based on the example clock signal 802. For example, the monoshot generator 804 may generate a pulse based on an edge (e.g., rising and/or falling) of the example clocked signal 802. The pulse of the example tON signal 806 closes the example switches 808 which powers the example bandgap core 801 and charges and/or discharges the example output capacitor 818 (e.g., depending on the state of the example PMOS 814).

Additionally, the example clock signal 802 is delayed and transmitted (e.g., via the example delayed clock signal 812) to the clock input 106 (FIG. 1) of the example clocked operational amplifier 100 to trigger operation of the example clocked operational amplifier 100. The example tON signal 806 pulses long enough for the example Vref 816 to be sampled on the example capacitor 818. After the example Vref 816 has been sampled and the pulse of the example tON signal 806 ceases, the example switches 808, 810 become open, thereby cutting power to the example bandgap core 801. Although the example bandgap core 801 remains unpowered until the next clock cycle, the voltage of the output of the example clocked operational amplifier 100 (e.g., the example output voltage 108 of FIGS. 1, 2, 3A, and/or 3B) retains its value, because the output voltage 108 is stored in the example capacitor 218, 318 of FIGS. 2, 3S, and/or 3B. As described above, retaining the example output voltage 108 allows the example bandgap core 801 to stabilize in significantly less time than conventional bandgap cores with convention operational amplifiers. In some examples, the voltage output by the example clocked operational amplifier 100 will not be entirely stable (e.g., the voltage may include voltage ripples around the average output voltage). Because the voltage output by the example clocked operational amplifier 100 may not be entirely stable, the voltage at the gate will not be entirely stable causing the example Vref 816 to slightly vary due to the voltage ripples. As further described below in conjunction with FIG. 9, additional output capacitors may be utilized to reduce such ripples on the example Vref 816.

Figure 9:
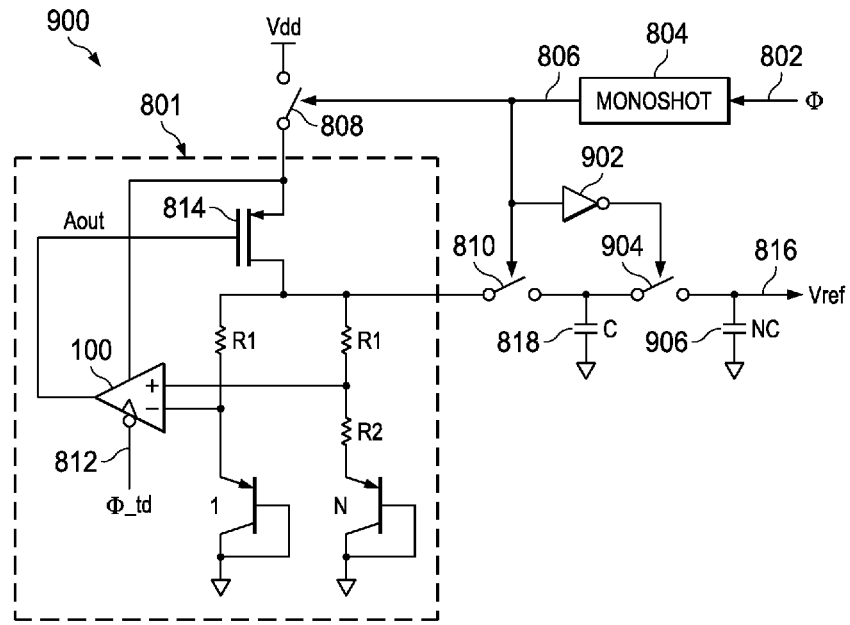
FIG. 9 is an example bandgap reference using the example clocked amplifier of FIGS. 1, 3A, and 3B.

FIG. 9 is an example circuit structure for an example bandgap reference 900 utilizing the example clocked operational amplifier 100 of FIGS. 1, 2, 3A, and/or 3B disclosed herein to provide a fixed voltage that does not vary with variations in power supply, temperature, and/or load while minimizing ripples on the example Vref 816. The example bandgap reference 900 includes the example bandgap core 801, the example clock signal 802, the example monoshot generator 804, the example tON signal 806, example switches 808, 810, the example delayed clock signal 812, the example PMOS 814, the example reference voltage (Vref) 816, and the example output capacitor 818 of FIG. 8. The example bandgap reference 900 further includes an example inverter 902, an example switch 904, and an filtering capacitor(s) 906.

The example inverter 902 of FIG. 9 inverts the example tON signal 806 (e.g., the output of the example monoshot 804) to control the example switch 904. Thus, the example switch 904 activates the example filtering capacitor 906 whenever the example tON signal 806 is a low voltage. The example filtering capacitor(s) 906 in combination with the example output capacitor 818 create a filter when the example switch 904 is closed (e.g., when the tON signal 806 is a low voltage), where the example output capacitor 818 acts like a resistor in an RC filter circuit. In this manner, any ripple on the example Vref 816 is reduced by a ratio corresponding to the capacitance of the output capacitor 818 and the capacitance of the filtering capacitor 906. For example, if the ripple on the example Vref 816 is 10 millivolts (mV), the capacitance of the example output capacitor 818 is 10 picofarads (pF), and the capacitance of the example filtering capacitor 906 is 250 pF, then the ripple is reduced by a factor of 25 (e.g., 10 mV (10 pF/250 pF)=0.4 mV). The example filtering capacitor(s) 906 may be one capacitor or multiple capacitors connected, or otherwise coupled, in parallel. If the example filtering capacitors 906 are multiple capacitors in parallel, the capacitance of the multiple filtering capacitors is equivalent to the sum of the capacitances of the multiple filtering capacitors. In some examples, gate to drain capacitance cancellation techniques may be used to limit the capacitance of the example switches 808, 810, 904.

In some examples, the clock signal 802 rate is chosen based on the worst case leakage corner (e.g., the conditions that generate the most leakage current flowing through Vref 816). Leakage current is undesired current that may cause the example Vref 816 to slightly rise or fall below the intended voltage. The amount of voltage rise/fall corresponding to the leakage current is the offset voltage. The offset voltage is a function of leakage current (e.g., Ilkg), the ratio between the capacitance of the filtering capacitor 906 and the output capacitor 818 (e.g., N), the clock pulse period (e.g., tCLK), and the capacitance of the output capacitor 818 (e.g., C), as shown below in equation 3:

$$V\text{offset}=I\text{lkg}*t\text{CLK}/C \qquad \text{(Equation 3)}$$

In some examples, the clock pulse period may be adjusted to limit the Voffset caused by the leakage current.

Figure 10:
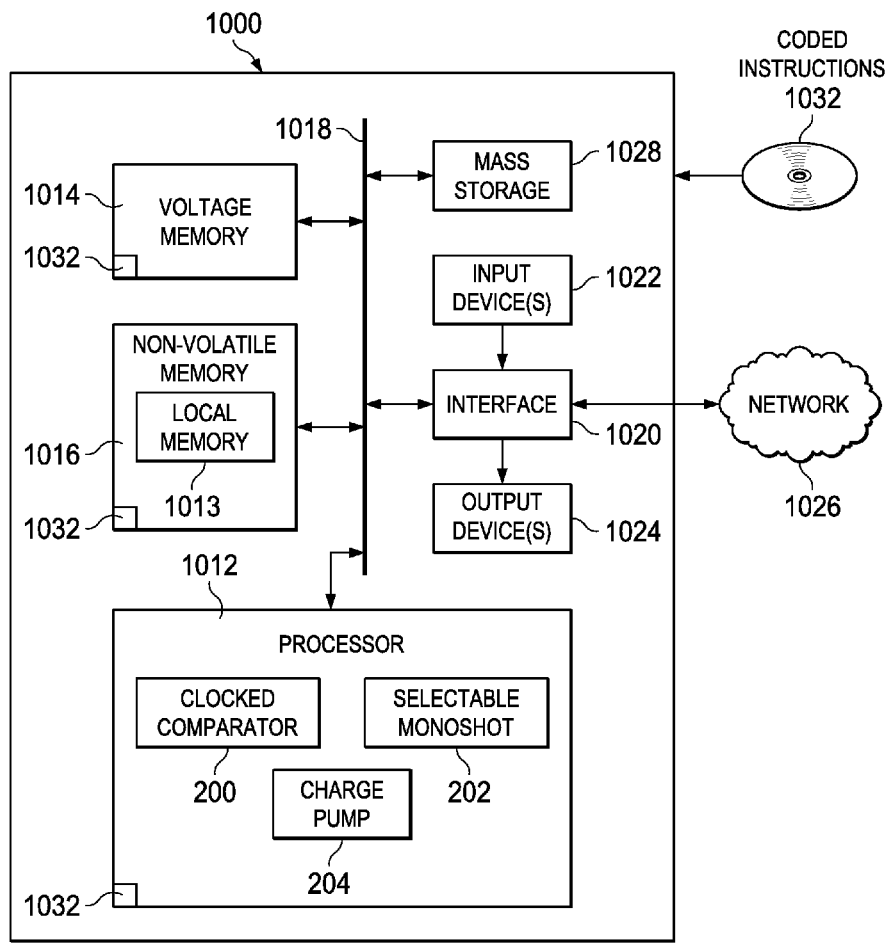
FIG. 10 is a block diagram of a processor platform structured to execute the example machine readable instructions of FIG. 6 to control the example clocked amplifier of FIGS. 1 and 2.

FIG. 10 is a block diagram of an example processor platform 1000 capable of executing the instructions of FIG. 3 to implement the example clocked operational amplifier 100 of FIGS. 1 and 2. The processor platform 1000 can be, for example, a server, a personal computer, a mobile device (e.g., a cell phone, a smart phone, a tablet such as an iPad™), a personal digital assistant (PDA), an Internet appliance, or any other type of computing device.

The processor platform 1000 of the illustrated example includes a processor 1012. The processor 1012 of the illustrated example is hardware. For example, the processor 1012 can be implemented by integrated circuits, logic circuits, microprocessors or controllers from any desired family or manufacturer.

The processor 1012 of the illustrated example includes a local memory 1013 (e.g., a cache). The example processor 1012 of FIG. 10 executes the instructions of FIG. 3 to implement the example clocked comparator 200, the example selectable monoshot 202, and the example charge pump 204 of FIG. 2 to implement the example distance estimator 116. The processor 1012 of the illustrated example is in communication with a main memory including a volatile memory 1014 and a non-volatile memory 1016 via a bus 1018. The volatile memory 1014 may be implemented by Synchronous Dynamic Random Access Memory (SDRAM), Dynamic Random Access Memory (DRAM), RAIVIBUS Dynamic Random Access Memory (RDRAM) and/or any other type of random access memory device. The non-volatile memory 1016 may be implemented by flash memory and/or any other desired type of memory device. Access to the main memory 1014, 1016 is controlled by a clock controller.

The processor platform 1000 of the illustrated example also includes an interface circuit 1020. The interface circuit 1020 may be implemented by any type of interface standard, such as an Ethernet interface, a universal serial bus (USB), and/or a PCI express interface.

In the illustrated example, one or more input devices 1022 are connected to the interface circuit 1020. The input device(s) 1022 permit(s) a user to enter data and commands into the processor 1012. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 1024 are also connected to the interface circuit 1020 of the illustrated example. The output devices 1024 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 1020 of the illustrated example, thus, typically includes a graphics driver card, a graphics driver chip or a graphics driver processor.

The interface circuit 1020 of the illustrated example also includes a communication device such as a transmitter, a receiver, a transceiver, a modem and/or network interface card to facilitate exchange of data with external machines (e.g., computing devices of any kind) via a network 1026 (e.g., an Ethernet connection, a digital subscriber line (DSL), a telephone line, coaxial cable, a cellular telephone system, etc.).

The processor platform 1000 of the illustrated example also includes one or more mass storage devices 1028 for storing software and/or data. Examples of such mass storage devices 1028 include floppy disk drives, hard drive disks, compact disk drives, Blu-ray disk drives, RAID systems, and digital versatile disk (DVD) drives.

The coded instructions 1032 of FIG. 6 may be stored in the mass storage device 1028, in the volatile memory 1014, in the non-volatile memory 1016, and/or on a removable tangible computer readable storage medium such as a CD or DVD.

Figure 11:
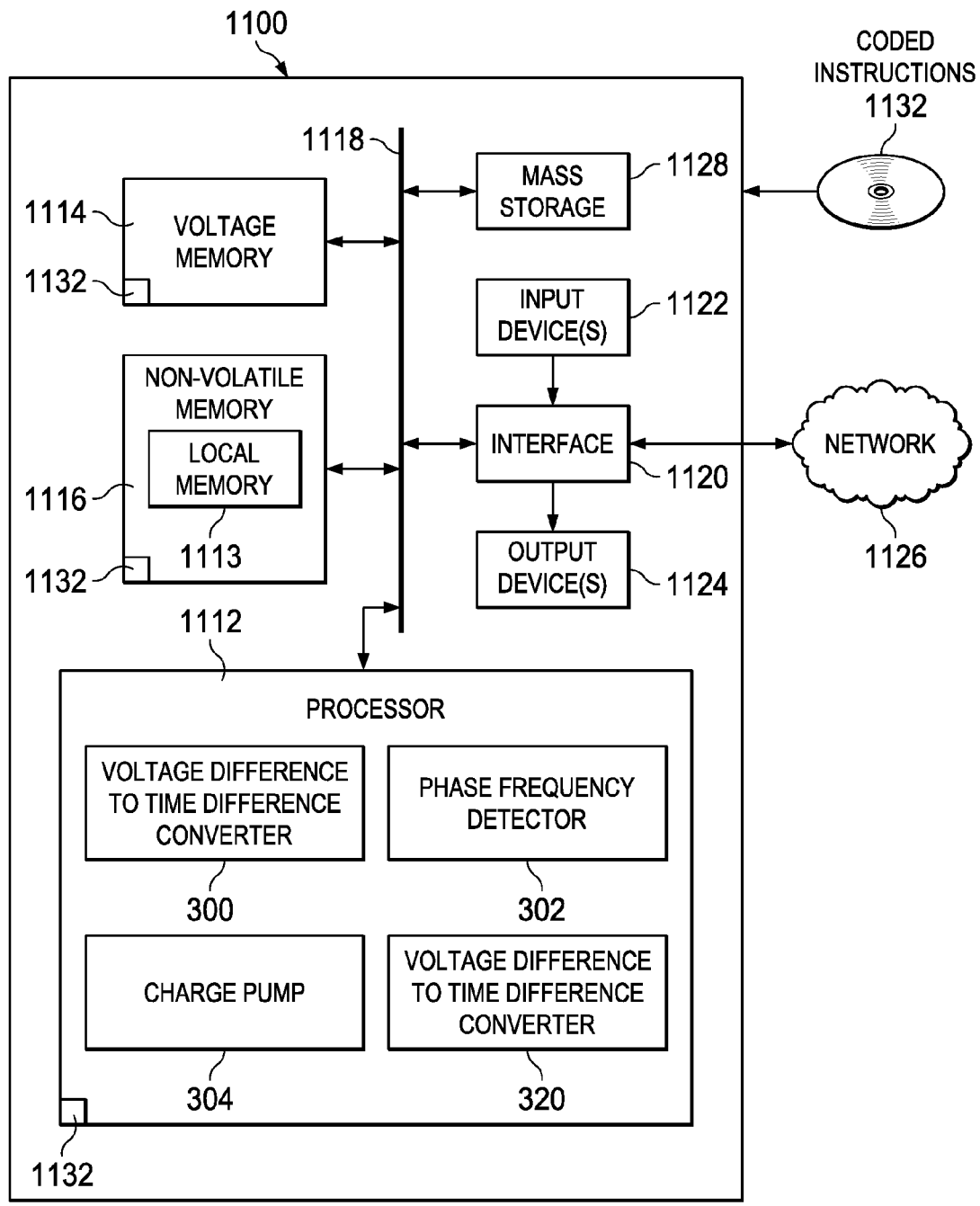
FIG. 11 is a block diagram of a processor platform structured to execute the example machine readable instructions of FIG. 7 to control the example clocked amplifier of FIGS. 1, 3A, and 3B.

FIG. 11 is a block diagram of an example processor platform 1100 capable of executing the instructions of FIG. 3 to implement the example clocked operational amplifier 100 of FIGS. 1 and 2. The processor platform 1100 can be, for example, a server, a personal computer, a mobile device (e.g., a cell phone, a smart phone, a tablet such as an iPad™), a personal digital assistant (PDA), an Internet appliance, or any other type of computing device.

The processor platform 1100 of the illustrated example includes a processor 1112. The processor 1112 of the illustrated example is hardware. For example, the processor 1112 can be implemented by integrated circuits, logic circuits, microprocessors or controllers from any desired family or manufacturer.

The processor 1112 of the illustrated example includes a local memory 1113 (e.g., a cache). The example processor 1112 of FIG. 11 executes the instructions of FIG. 3 to implement the example VDTD converter 300, the example phase frequency detector 302, the example charge pump 304, and the example VDTD converter 320 of FIG. 2 to implement the example distance estimator 116. The processor 1112 of the illustrated example is in communication with a main memory including a volatile memory 1114 and a non-volatile memory 1116 via a bus 1118. The volatile memory 1114 may be implemented by Synchronous Dynamic Random Access Memory (SDRAM), Dynamic Random Access Memory (DRAM), RAIVIBUS Dynamic Random Access Memory (RDRAM) and/or any other type of random access memory device. The non-volatile memory 1116 may be implemented by flash memory and/or any other desired type of memory device. Access to the main memory 1114, 1116 is controlled by a clock controller.

The processor platform 1100 of the illustrated example also includes an interface circuit 1120. The interface circuit 1120 may be implemented by any type of interface standard, such as an Ethernet interface, a universal serial bus (USB), and/or a PCI express interface.

In the illustrated example, one or more input devices 1122 are connected to the interface circuit 1120. The input device(s) 1122 permit(s) a user to enter data and commands into the processor 1112. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 1124 are also connected to the interface circuit 1120 of the illustrated example. The output devices 1124 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 1120 of the illustrated example, thus, typically includes a graphics driver card, a graphics driver chip or a graphics driver processor.

The interface circuit 1120 of the illustrated example also includes a communication device such as a transmitter, a receiver, a transceiver, a modem and/or network interface card to facilitate exchange of data with external machines (e.g., computing devices of any kind) via a network 1126 (e.g., an Ethernet connection, a digital subscriber line (DSL), a telephone line, coaxial cable, a cellular telephone system, etc.).

The processor platform 1100 of the illustrated example also includes one or more mass storage devices 1128 for storing software and/or data. Examples of such mass storage devices 1128 include floppy disk drives, hard drive disks, compact disk drives, Blu-ray disk drives, RAID systems, and digital versatile disk (DVD) drives.

The coded instructions 1132 of FIG. 7 may be stored in the mass storage device 1128, in the volatile memory 1114, in the non-volatile memory 1116, and/or on a removable tangible computer readable storage medium such as a CD or DVD.

From the foregoing, it would be appreciated that the above disclosed method, apparatus, and articles of manufacture providing an ultra-low power bandgap reference using a clocked amplifier are disclosed. Examples disclosed herein provide a clocked operational amplifier that samples an amplified difference between two inputs at a clock edge and holds the amplified difference until a subsequent clock pulse is received. Examples disclosed herein utilize the clocked operational amplifier in a bandgap reference to generate a reference voltage that is invariant to temperate variation, supply voltage variation, and/or load variation.

Conventional techniques utilize a conventional operational amplifier in a bandgap reference. However, such conventional techniques require waiting a significant amount of time for a bandgap core of the bandgap reference to stabilize before sampling, thereby consuming more power. Examples disclosed herein alleviate such problems by utilizing the clocked operational amplifier which is able to hold an output regardless of power. Using example disclosed herein, an ultra-low power bandgap reference drawing an average of over 30 times less current than conventional methods.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

What is claimed is:
1. An apparatus comprising:
    a clocked comparator to compare a first voltage to a second voltage when a clock signal pulses and output a comparison signal based on the comparison, the comparison signal being (A) a first signal when the first voltage is higher than the second voltage and (B) a second signal when the first voltage is lower than the second voltage;

a monoshot to:
when the comparison signal is a first signal, output a first pulse; and
when the comparison signal is a second signal, output a second pulse; and a charge pump to:
increase an output voltage when the monoshot outputs the first pulse;
decrease the output voltage when the monoshot outputs the second pulse; and
hold the output voltage when the monoshot is not outputting the first and second pulses.

2. The apparatus of claim 1, wherein the clocked comparator is structured to compare the first voltage to the second voltage at a rising edge of a clock signal pulse.

3. The apparatus of claim 1, wherein the clocked comparator is structured to compare the first voltage to the second voltage when the clock signal is a high voltage.

4. The apparatus of claim 1, wherein the monoshot is structured to:
receive the clock signal pulses; and
output the first pulse and second pulse when the clock signal is a high voltage.

5. The apparatus of claim 1, wherein the monoshot is structured to output the first pulse as a low pulse on a high voltage output and output the second pulse as a high pulse on a low voltage output.

6. The apparatus of claim 1, wherein the charge pump includes:
a first transistor to receive the first pulse, the first pulse enabling the first transistor;
a second transistor to receive the second pulse, the second pulse enabling the second transistor; and
a capacitor to store and hold the output voltage.

7. The apparatus of claim 6, wherein:
when the first transistor is enabled, a supply voltage charges the capacitor to increase the output voltage;
when the second transistor is enabled, a ground voltage discharges the capacitor to decrease the output voltage; and
when the first and second transistors are disabled, the output voltage is held by the capacitor.

8. The apparatus of claim 1, wherein the clocked comparator is structured to output an amplified difference between the first voltage and the second voltage, the amplified difference being the comparator output.

9. A computer readable storage medium comprising instructions which, when executed, cause a machine to at least:
compare a first voltage to a second voltage when a clock signal pulses and output a comparison signal based on the comparison, the comparison signal being (A) a first signal when the first voltage is higher than the second voltage and (B) a second signal when the first voltage is lower than the second voltage;
when the comparison signal is a first signal, output a first pulse, the first pulse increasing an output voltage; and
when the comparison signal is a second signal, output a second pulse, the second pulse decreasing the output voltage; and
hold the output voltage when the first and second pulses are not being output.

10. The computer readable medium of claim 9, wherein the instructions cause the machine to compare the first voltage to the second voltage at a rising edge of a clock signal pulse.

11. The computer readable medium of claim 9, wherein the instructions cause the machine to compare the first voltage to the second voltage when the clock signal is a high voltage.

12. The computer readable medium of claim 9, wherein the instructions cause the machine to:
receive the clock signal pulses; and
output the first pulse and second pulse when the clock signal is a high voltage.

13. The computer readable medium of claim 9, wherein the instructions cause the machine to output the first pulse as a low pulse on a high voltage output and output the second pulse as a high pulse on a low voltage output.

14. The computer readable medium of claim 9, wherein:
the first pulse enables a first transistor;
the second pulse enables a second transistor; and
the output voltage is stored and held by a capacitor.

15. The computer readable medium of claim 14, wherein the instructions cause the machine to:
when the first transistor is enabled, charge the capacitor to increase the output voltage; and
when the second transistor is enabled, discharge the capacitor to decrease the output voltage, and wherein when the first and second transistors are disabled, the output voltage is held by the capacitor.

16. The computer readable medium of claim 9, wherein the instructions cause the machine to output an amplified difference between the first voltage and the second voltage, the amplified difference being the comparator signal.

17. A method comprising:
comparing a first voltage to a second voltage when a clock signal pulses and output a comparison signal based on the comparison, the comparison signal being (A) a first signal when the first voltage is higher than the second voltage and (B) a second signal when the first voltage is lower than the second voltage;
when the comparison signal is a first signal, outputting a first pulse, the first pulse increasing an output voltage;
when the comparison signal is a second signal, outputting a second pulse, the second pulse decreasing the output voltage; and
holding the output voltage when the first and second pulses are not being output.

18. The method of claim 17, wherein the comparing of the first voltage to the second voltage occurs at a rising edge of a clock signal pulse.

19. The method of claim 17, wherein the comparing of the first voltage to the second voltage occurs when the clock signal is a high voltage.

* * * * *